United States Patent
Guan

(10) Patent No.: US 8,737,556 B2
(45) Date of Patent: *May 27, 2014

(54) DELAY LOCK LOOP PHASE GLITCH ERROR FILTER

(75) Inventor: Long B. Guan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 171 days.

This patent is subject to a terminal disclaimer.

(21) Appl. No.: 13/271,048

(22) Filed: Oct. 11, 2011

(65) Prior Publication Data

US 2012/0019293 A1      Jan. 26, 2012

Related U.S. Application Data

(63) Continuation of application No. 10/933,204, filed on Sep. 2, 2004, now Pat. No. 8,036,334.

(30) Foreign Application Priority Data

Aug. 30, 2004    (SG) .............................. 200404850-0

(51) Int. Cl.
*H03D 3/24*          (2006.01)

(52) U.S. Cl.
USPC ............ 375/373; 375/342; 375/377; 375/362

(58) Field of Classification Search
USPC ........................................ 375/342, 362, 377
See application file for complete search history.

(56) References Cited

U.S. PATENT DOCUMENTS

| | | | |
|---|---|---|---|
| 5,767,715 A | 6/1998 | Marquis et al. | |
| 5,841,303 A * | 11/1998 | Takashi et al. | 327/156 |
| 6,222,895 B1 | 4/2001 | Larsson | |
| 6,262,634 B1 * | 7/2001 | Flanagan et al. | 331/25 |
| 6,664,830 B2 | 12/2003 | Miller | |
| 7,058,150 B2 | 6/2006 | Buchwald et al. | |
| 2003/0098732 A1 | 5/2003 | Lin | |
| 2004/0140836 A1* | 7/2004 | Miller | 327/233 |

FOREIGN PATENT DOCUMENTS

WO         99/67882        12/1999
WO         02/29975 A2      4/2002

OTHER PUBLICATIONS

Austrailian Patent Office Search Report dated Jun. 27, 2006 for Singapore Application No. 200404850-0.

* cited by examiner

*Primary Examiner* — Qutbuddin Ghulamali
(74) *Attorney, Agent, or Firm* — Dorsey & Whitney LLP

(57) ABSTRACT

A method and apparatus is provided for providing a phase glitch error filter for a delay lock loop. The device comprises a delay lock loop to provide an output signal based upon a phase difference between a reference signal and a feedback signal. The delay lock loop comprises a filter unit to provide filtering of noise on a phase control signal to substantially reduce a false delay lock loop state.

19 Claims, 8 Drawing Sheets

| PHASE_1 | PHASE_2 | Result |
|---|---|---|
| 1 (logic high) | 1 (logic high) | Shift-Left |
| 1 (logic high) | 0 (logic low) | Phase-Equal |
| 0 (logic low) | 0 (logic low) | Shift-Right |
| 0 (logic low) | 1 (logic high) | Shift-Right-180 |

FIGURE 5

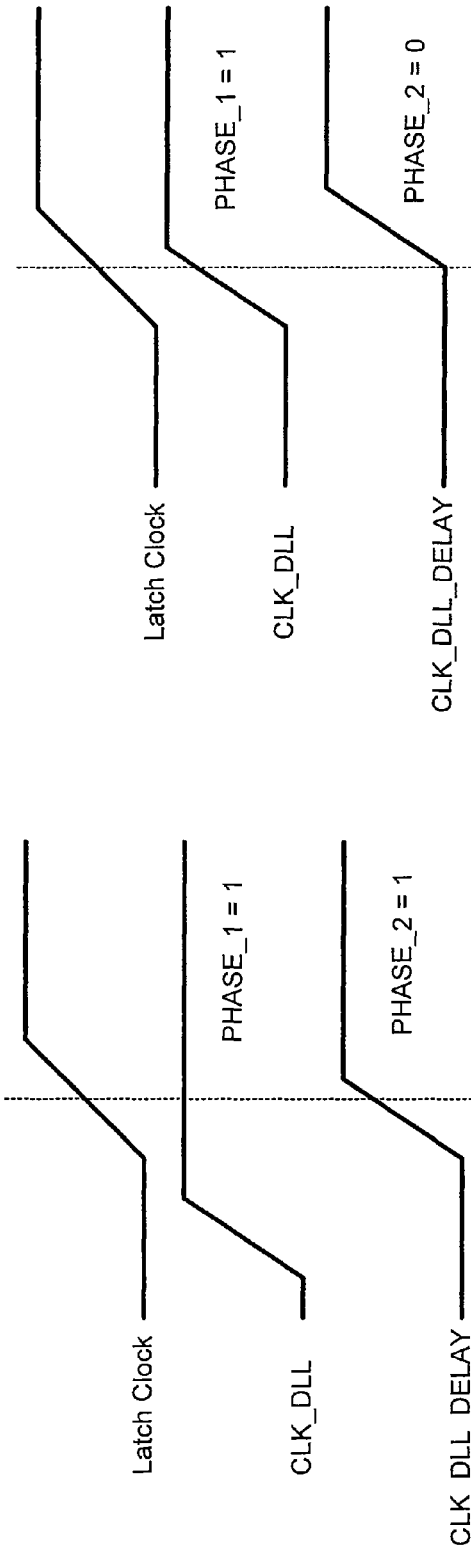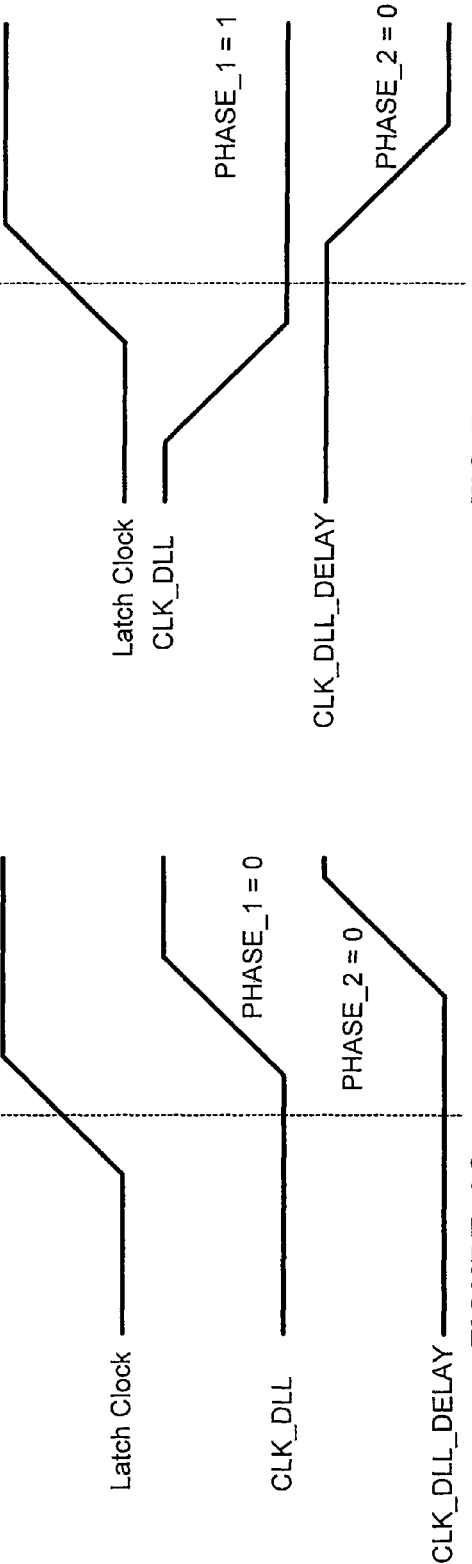

DELAY LOCK LOOP PHASE GLITCH ERROR FILTER

CROSS-REFERENCE TO RELATED APPLICATIONS

This application is a continuation of U.S. patent application Ser. No. 10/933,204, filed Sep. 2, 2004, U.S. Pat. No. 8,036,334, which claims priority to Singapore Patent Application No. 200404850-0, filed Aug. 30, 2004. These applications are incorporated by reference herein in their entirety and for all purposes.

FIELD OF THE INVENTION

This invention relates generally to an electronic device, and, more specifically, to performing a filtering process for a delay lock loop circuit.

DESCRIPTION OF THE RELATED ART

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which are more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Typically, digital systems, such as memory systems, may comprise a delay lock loop that may be used to align the edges of a plurality of digital signals. For example, a delay lock loop circuit may be used to align the rising edge and/or the falling edge of a clock signal based upon a reference clock signal, to produce a synchronized clock signal. Many times, digital signals from multiple sources access one or more memory spaces in a memory unit. It is desirable that these digital signals be synchronized for proper access of memory. Typical delay lock loops comprise a phase detect unit that detects the phase differences between a plurality of signals. The output of the phase detect unit is then used to affect the operation of a filter that adjusts the delay of an output of the delay lock loop. Typical delay lock loop circuits provide a delay block and a delay line (DLL delay line) that implement a delay upon an input clock signal to produce a delayed, output clock signal.

Generally, the delay lock loops (DLL) comprise various logic sections that initiate and terminate the implementation of various delay lines in the delay lock loops. A DLL system may contain various programming or logic-based sections to synchronize various signals, implement various aspects of delay stages, etc. Often, there is state-machine type logic that guides the various portions of the delay lock loop through various states.

Often, a phase detection scheme is provided in the delay lock loop in order to implement various stages of the delays provided by delay lock loop. Various clock signals are monitored to perform such phase detection and based upon certain aspects of clocks, various states of the delay lock loop portions are entered. One problem that occurs with state-of-the-art implementation of delay lock loops include the fact that a noise in the clock that influences the operation of the delay lock loop may cause the various logic sections within the delay lock loops to enter unintended states. For example, when a delay lock loop is configured to shift-left or to shift-right, various portions of a clock may mistakenly cause a phase control signal to prompt a shift in a wrong direction due to noise in a clock. Errors in the clock, such as clock jitters, due to noise, may also cause a termination of an operation of the delay lock loop. Unexpected results resulting from clock jitters may cause the various logic sections in the delay lock loop to exit the delay lock loop state. This could lead to unlocking of various clock signals, which could lead to errors in data transmission. As a result, phase errors may occur and a device using the delay lock loop may malfunction.

The present invention is directed to overcoming, or at least reducing, the effects of, one or more of the problems set forth above.

SUMMARY OF THE INVENTION

In one aspect of the instant invention, a device is provided for providing a phase glitch error filter for a delay lock loop. The device comprises a delay lock loop to provide an output signal based upon a phase difference between a reference signal and a feedback signal. The delay lock loop comprises a filter unit to provide filtering of noise on a phase control signal to substantially reduce a false delay lock loop state.

In another aspect of the instant invention, a delay lock loop is provided for providing a phase glitch error filter for a delay lock loop. The delay lock loop provides an output signal based upon a phase difference between a reference signal and a feedback signal. The delay lock loop comprises a delay unit, a phase detector, a feedback delay unit, and a filter unit. The delay unit provides a delay line to generate the output signal based upon a reference signal. The delay unit further comprises a register to control the delay line. The register is capable of shifting left and shifting right to provide a signal to control a delay operation performed by the delay unit. The phase detector determines the phase difference between the reference signal and the feedback signal. The phase detector generates at least a first phase signal and a second phase signal. The feedback delay unit provides a delay upon a synchronized output signal provided by the delay unit to generate the feedback signal. The filter unit is operatively coupled to the phase detector. The filter unit filters a phase control signal from the phase detector to provide a filtered phase control signal to the delay unit.

In another aspect of the instant invention, a memory device is provided for providing a phase glitch error filter for a delay lock loop. The memory device comprises a delay lock loop to provide an output signal based upon a phase difference between a reference signal and a feedback signal. The delay lock loop comprises a filter unit to provide filter noise on a phase control signal to substantially reduce a false delay lock loop state.

In yet another aspect of the instant invention, a system board is provided for providing a phase glitch error filter for a delay lock loop. The system board comprises a first device and a second device. The first device comprises a memory location for storing data and a delay lock loop to provide an output signal based upon a phase difference between a reference signal and a feedback signal. The delay lock loop comprises a filter unit to provide filtering of noise on a phase control signal to substantially reduce a false delay lock loop state. The second device is operatively coupled to the first device. The second device accesses data from the first device based upon an operation performed by the delay lock loop.

BRIEF DESCRIPTION OF THE DRAWINGS

The invention may be understood by reference to the following description taken in conjunction with the accompanying drawings, in which like reference numerals identify like elements, and in which:

FIG. 5 illustrates a truth table relating to various states entered by the delay lock loop circuit based upon signals from the phase detection circuit of FIG. 4, in accordance with one illustrative embodiment of the present invention;

FIGS. 6A-6D illustrate timing diagrams relating to the various states entered by the delay lock loop circuit, in accordance with one illustrative embodiment of the present invention;

Figure 1:
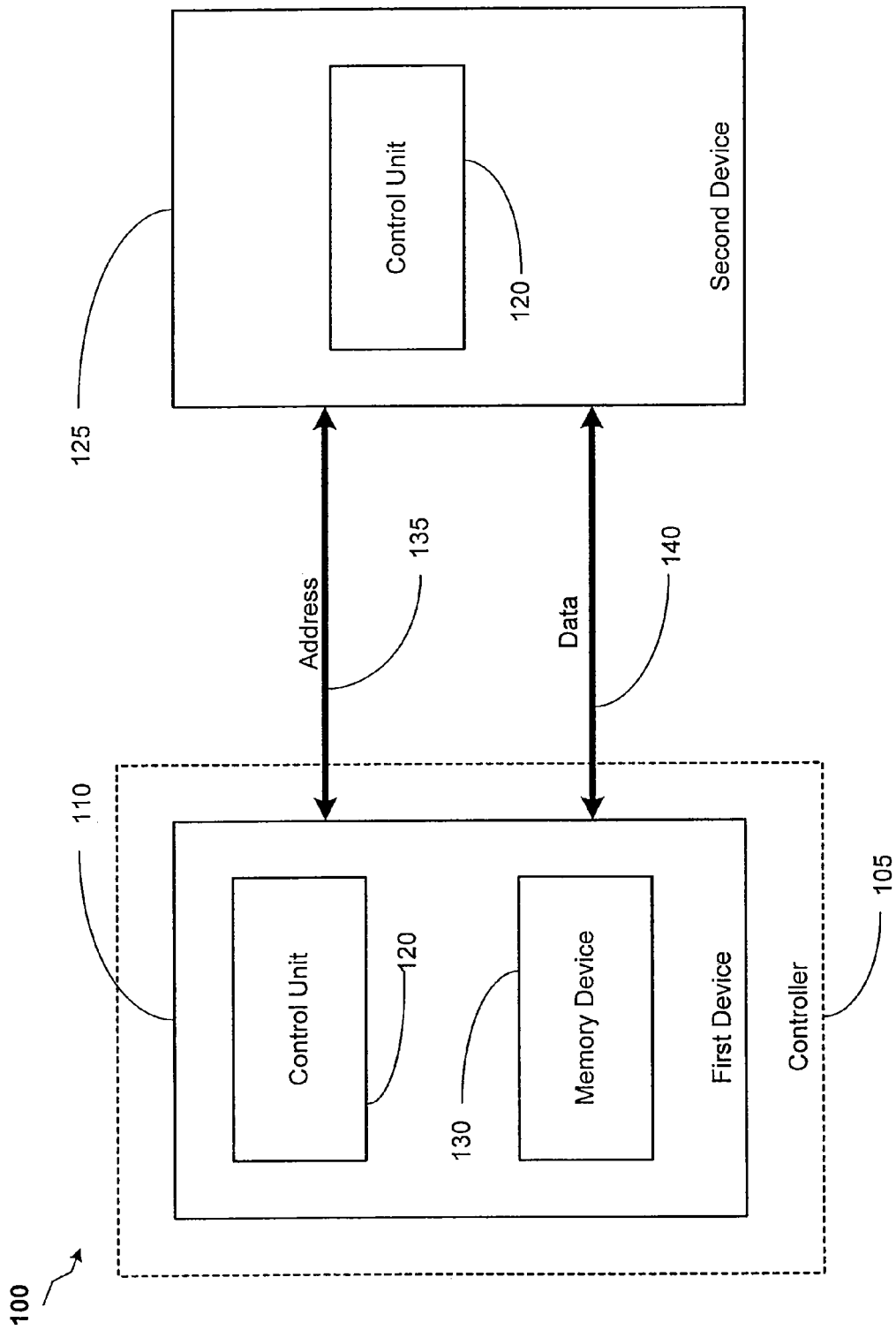
FIG. 1 is a block diagram of a system including a device that is capable of accessing digital signals, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Synchronization between multiple digital signals in a digital system is important for accurate exchange of digital data. Often, delay lock loops are employed to synchronize digital signals. Embodiments of the present invention provide for implementing a filtration of a clock signal and/or a phase control signal generated by using the clock signal. The phase control signal is used to affect the operation of a delay lock loop (DLL) circuitry. A clock signal may affect the operation of a phase detection system that is part of a delay lock loop circuit. Often, the phase detection circuit provides a signal relating to a particular phase that is used by various logics in the DLL to enter various states associated with the DLL circuitry. Jitters or other noise problems in the clock signal may prompt the phase control signal to cause the DLL circuit to enter undesirable states causing signal locking errors. Data transmission may be compromised as a result of improper operation of the delay lock loop circuitry.

Embodiments of the present invention provide for filtering the phase control signal such that any potential jitters due to noise in the signal would not cause an inadvertent change of a DLL state in the DLL circuitry. In one embodiment, a counter may be implemented into the filter, such that a minimum predetermined time period of an assertion of a phase control signal is required before an actual assertion is recognized. This filtration may result in more correct state transitions in the DLL circuitry. When a noise or jitter effect is not present in the clock signal, the DLL of embodiments of the present invention would then operate in a normal fashion. In other words, the presence of the filter does not adversely affect the normal operation of the DLL circuitry.

Referring to FIG. 1, a block diagram of a system 100 is illustrated, in accordance with one embodiment of the present invention. The system 100 comprises a first device 110, which, in one embodiment, may comprise a memory device 130 capable of storing data. In one embodiment, the memory device 130 may be a dynamic random access memory (DRAM), a static random access memory (SRAM), a double-data rate synchronous DRAM (DDR SDRAM), a Rambus™ DRAM (RDRAM), a FLASH memory device, or the like. The first device 110 may be encompassed by a controller 105. In one embodiment, the controller 105 may be a memory controller, a computer system, such as a PC-computer, and the like. The first device 110 may be accessed by a second device 125, which, in one embodiment, may be an accessing/access device. The second device 125 may send addresses on a line 135 to the first device 110. The first device 110 may provide data to the second device 125 on a line 140. The first and second devices 110, 125 may comprise a control unit 120 capable of accessing data (including code) stored in the memory device 130 of the first device 110. The second device 125 may be any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing devices.

In one embodiment, the first device 110 may be a memory chip device, such as a DRAM device, an SRAM device, a FLASH memory device, and the like. In one embodiment, the first device 110 may be a memory chip device that may be implemented into a digital system, such as a computer system. In an alternative embodiment, the first device 110 may be an external memory, such as a memory stick, and may be accessed when inserted into a slot (not shown) of the second device 125. When inserted into the slot, the second device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory device) that is integrated within the computer system to store data (e.g., BIOS [basic input/output system]) related to the computer system.

Figure 2:
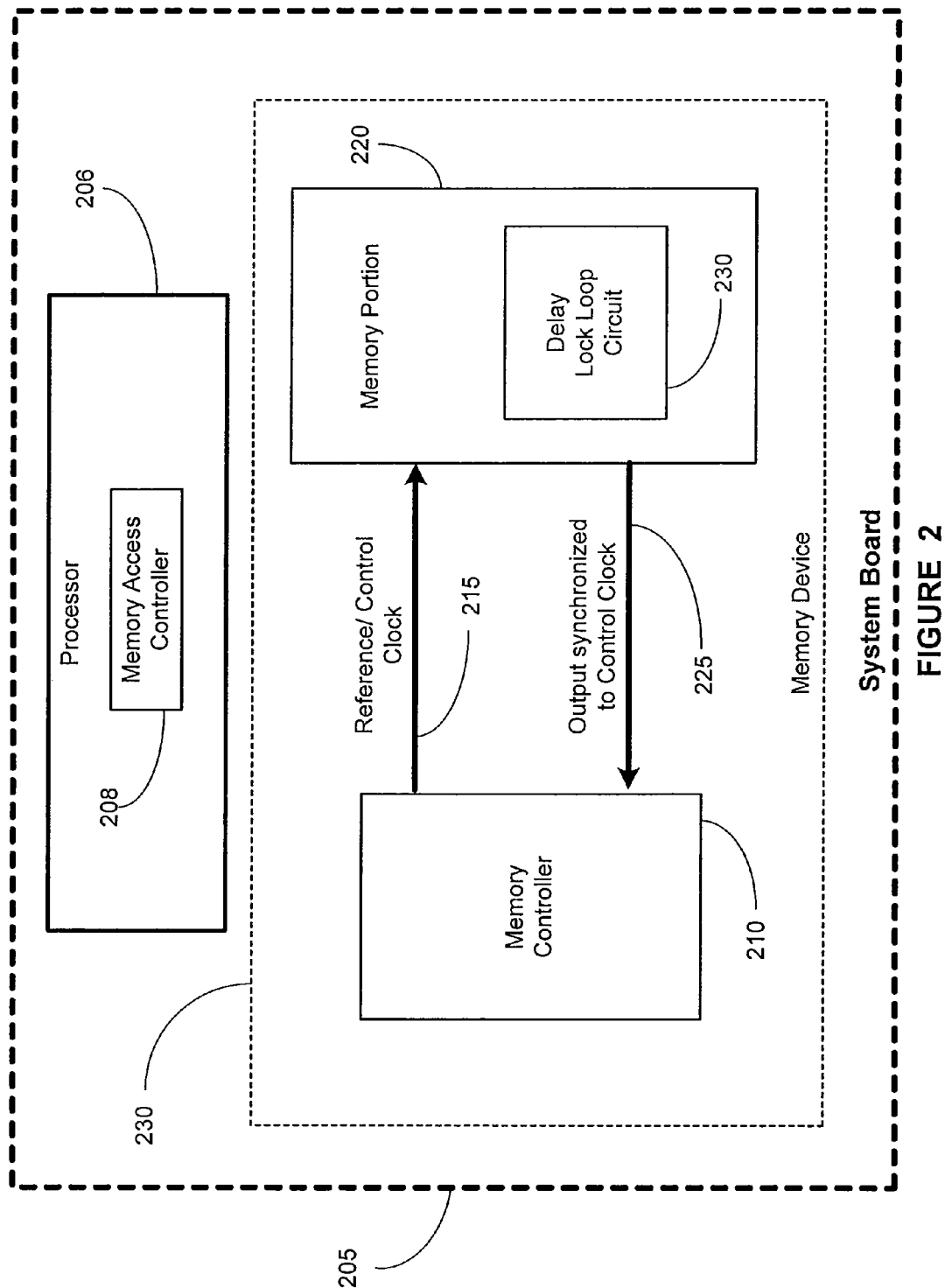
FIG. 2 is a more detailed block diagram representation of a system board including a memory device of FIG. 2, in accordance with one illustrative embodiment of the present invention.

Turning now to FIG. 2, a more detailed block diagram depiction of the memory device 130 in accordance with one illustrative embodiment of the present invention is provided. In one embodiment, the memory device 130 comprises a memory controller 210, which is operatively coupled to one or more memory portions 220. The memory controller 210 may comprise circuitry that provides access (e.g., such as storing and extracting data to and from the memory portions 220) to control operations of the memory device 130. The memory portion 220 may be an array of memory storing modules that are capable of storing data.

Proper timing of the data signals carrying data from the memory portion 220 is useful in extracting data accurately. For example, if the period of the control clock is 5 nanoseconds, and the data is to be sent or received on every clock edge of the control clock on a line 215 (e.g., as in the case of a double data rate [DDR SDRAM]) then there is a 2.5 nanosecond maximum timing window available to send or receive the data. Therefore, a delay lock loop may be employed to synchronize various digital signals (e.g., operation clocks, data signals, etc.) to ensure that data access is performed within acceptable timing windows.

In one embodiment, the memory portion 220 may comprise a delay lock loop circuit 230. In alternative embodiments, the delay lock loop circuit 230 may reside in other portions of the memory device 130, such as in the memory controller 210. The delay lock loop circuit 230 is capable of locking a plurality of digital signals based upon a reference or a control clock on a line 215. A delay generated by the delay lock loop circuit 230 may be used to synchronize the output signal carrying data from the memory portion 220 to an external clock, such as a control clock derived from a system clock. The memory portion 220 is capable of providing one or more output signals to the memory controller 210 based upon a reference or control clock received by the memory portion 220. The reference/control clock on a line 215 may be generated by the memory controller 210 and/or from a component external to the memory device 130, such as the control unit 220.

In one embodiment, the memory portion 220 receives a control clock on the line 215 from the memory controller 210. The delay lock loop circuit 230 is capable of utilizing the control clock on the line 215 and providing an output synchronized to the control clock on a line 225. The memory controller 210 may use the output that is synchronized to the control clock on the line 215 to supply data to outside sources, such as the second device 125 and/or various components associated with the first device 110 (see FIG. 1).

Continuing to refer to FIG. 2, improvements in delay lock loop synchronization of digital signals may result in more accurate and efficient storing and/or extraction of data to and from the memory portion 220. The delay lock loop circuit 230 is capable of aligning the input edges and/or the output edges of various digital signals based upon the control clock on the line 215. The delay lock loop circuit 230 is capable of performing a phase detect function based upon the control clock on the line 215, and creating a feedback loop to lock the edges of a plurality of digital signals. Using the delay lock loop circuit 230, multiple signals may be synchronized for effective and accurate transmission of data.

As shown in FIG. 2, the memory device 130 may be part of a system board 205 (e.g., a printed circuit board) that includes a processor 206. The system board 205 may be a motherboard that is utilized in a variety of types of computer systems, such as an IBM compatible computer system, a workstation computer system, a mainframe computer system, an Apple computer system, a portable computer, a PDA, and the like. The memory controller 210 is capable of receiving and executing memory access functions in response to instructions from the processor 206. The processor 206 may comprise a memory access controller 208 that is used by the processor 206 to access data in the memory device 130.

Figure 3:
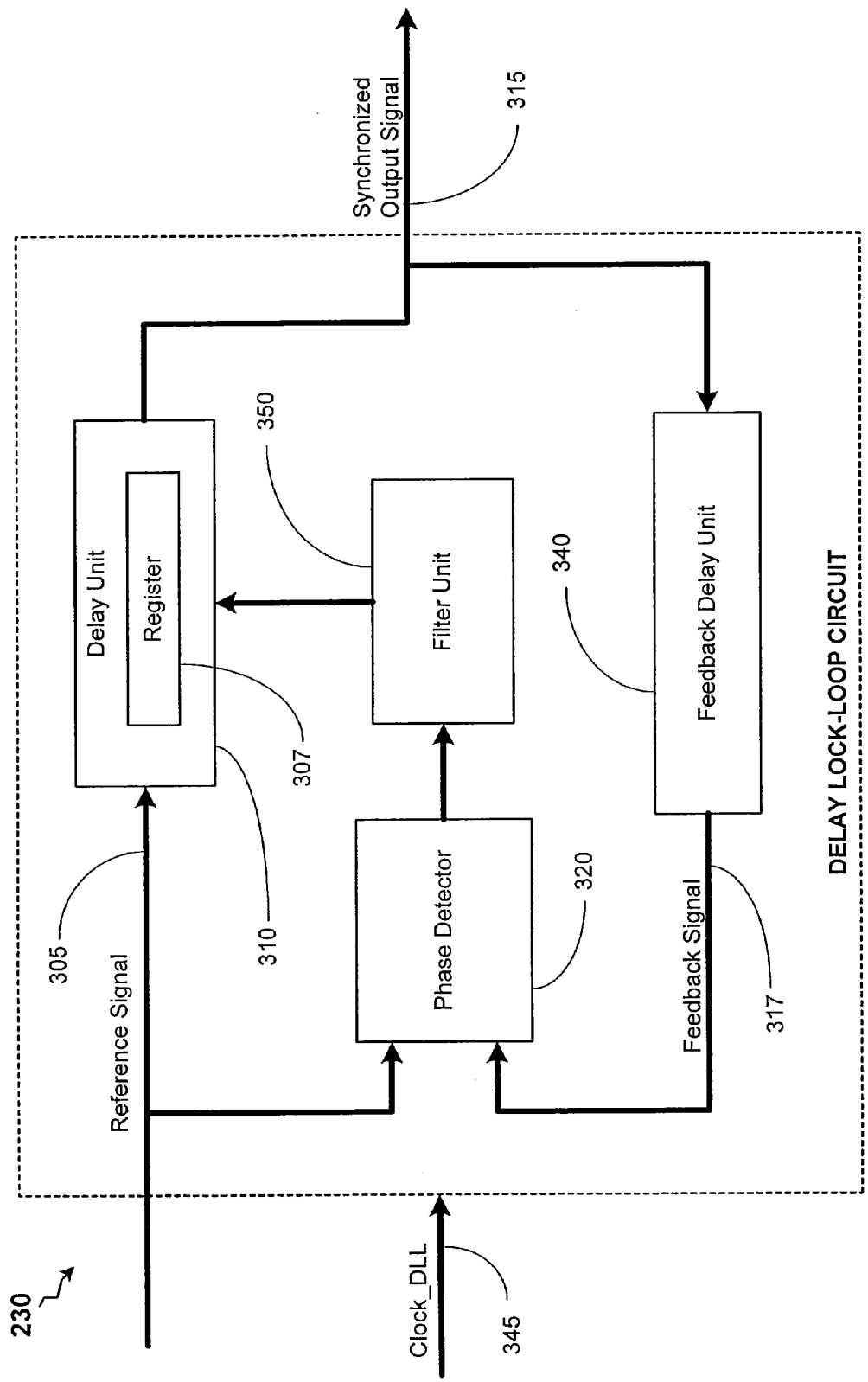
FIG. 3 illustrates a block diagram representation of a delay lock loop circuit of FIG. 2, in accordance with one illustrative embodiment of the present invention.

Turning now to FIG. 3, a more detailed description of the delay lock loop circuit 230 is illustrated. In one embodiment, the delay lock loop circuit 230 comprises a delay unit 310, a feedback delay unit 340, and a phase detector 320, and a filter unit 350. Some portions of the delay lock loop circuit 230 are not shown as to not obscure the present invention, however, those skilled in the art having benefit of the present disclosure would be able to implement all portions of the delay lock loop circuit 230 and remain with the scope and spirit of the present invention.

The delay unit 310 provides a delay based upon a reference clock, which may be the control clock on the line 315. In one embodiment, the delay unit 310 implements a delay adjustment onto the reference signal (e.g., a reference clock signal) on a line 305. Although a single block (block 310) is shown to represent a delay implemented onto the reference signal on the line 305, it would be appreciated by those skilled in the art having benefit of the present disclosure that there may be a plurality of delay stages with the delay unit 310. For example the delay unit 310 may include a course delay and a fine-tune delay that may be separately controlled by the delay lock loop circuit 230. The signal delayed by the delay unit 310 is provided as a synchronized output signal on a line 315. The synchronized output signal on the line 315 may be used to clock in and out various data lines to and from the memory device 130.

The feedback delay unit 340 provides a feedback delay for the phase detector 320 on a line 317. In one embodiment, the synchronized output signal on the line 315 is delayed by the feedback delay unit 340. The phase detector 320 detects a phase difference between the reference signal on the line 305 and the signal from the feedback delay unit 340 on the line 317. The phase detector 320 provides a signal that indicates the phase difference between the reference lock and the feedback clock on the line 317. The phase detector 320 provides a delay signal to the delay unit 310, which may be based on a control signal sent to the delay lock loop circuit 230.

The output of the delay lock loop circuit 230 provides a synchronized output signal on the line 315 for providing synchronized extraction of data to and from the memory device 130. Generally, the delay lock loop circuit 230 provides a first order control system that is generally stable and does not generally accumulate substantial phase error. In one embodiment, the absence of a significant phase error may be due to the elimination of a voltage control oscillator, which may cause jitter(s) in the resulting transfer function. In one embodiment, as compared to a voltage control oscillator, the delay lock loop is generally not a frequency synthesizer and is typically more immune to noise.

The delay unit 310 also comprises a register 307 to provide a delay shift to left or right to provide the synchronized output signal on the line 315. The register 307 may hold various bits (e.g., the register 307 may be a 4-bit register) that may be attached to various delay elements. Various bits in the register may toggle to enable or disable various delay elements to implement a delay on a clock signal. The bits in the register 307 may be indicative of various states entered by the delay unit 310. For example, the delay unit 310 may enter a shift-left state, a shift-right state, a shift-left-180 degrees state, and a phase-equal state. The phase-equal state may indicate that a reference signal and a feedback signal have substantially the same phase and may be, synchronized. A more detailed illustration and description of the delay unit 310 in accordance with one embodiment of the present invention is provided in FIG. 7 and accompanying description below.

The filter unit 350 in the DLL circuit 230 is capable of filtering a phase indication (i.e., a phase control signal) signal from the phase detector 320. The filter unit 350 monitors the assertion of one or more phase indication/control signals, such that the implementation of the delays provided by the delay unit 310 is effectuated based upon the filtered version of the phase indication/control signal. The filter unit 350 would then provide normal operation of the DLL circuit 230 in the absence of any errors in the clock signal that would prompt a false phase indication signal. In other words, a glitch in the reference signal may prompt a false phase control signal by the phase detector 320, which may then be filtered by the filter unit 350, thereby preventing the delay unit 310 from causing the DLL circuit 230 to enter an unknown or undesirable state. This provides for reducing the possibility of errors in the synchronized output signal 315. A more detailed illustration and description of the operation of various portions of the DLL circuit 230 is provided below in various figures and accompanying description below.

Figure 4:
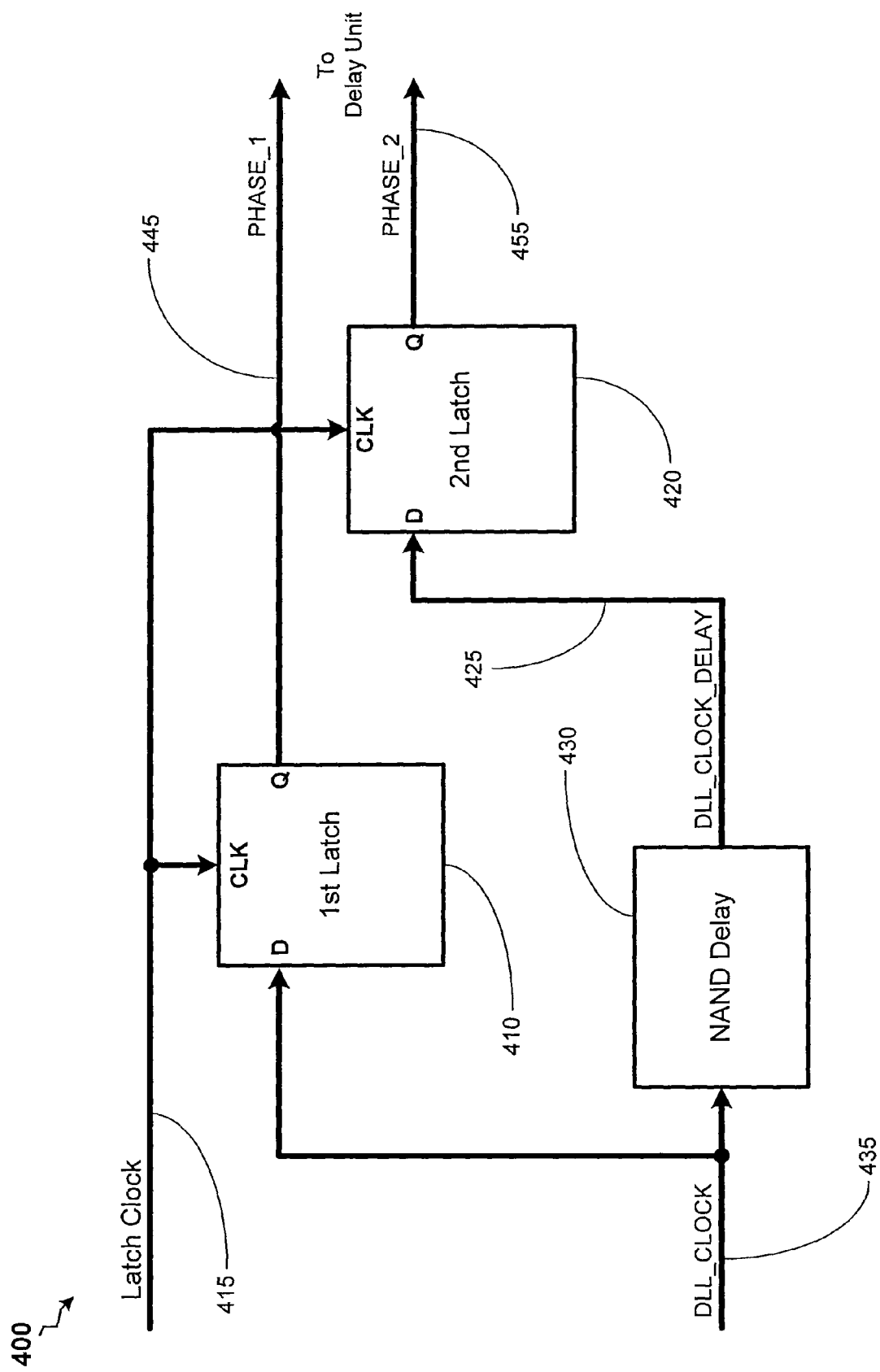
FIG. 4 is a more detailed block diagram representation of a phase detection circuit, in accordance with one illustrative embodiment of the present invention.

Turning now to FIG. 4, a simplified depiction of a phase detection provided by the DLL circuit 230 in accordance with embodiments of the present invention is illustrated. The phase detection circuit 400 comprises various latches and delays, such as NAND delays, to implement a state operation provided by the DLL circuit 230. For clarity of explanation a limited number of components are illustrated in FIG. 4, however, it would be appreciated by those skilled in the art having benefit of the present disclosure that various other circuit portions, such as latches, delays, and other logic units, may be implemented into the phase detection circuit 400 and remain within the spirit and scope of the present invention.

The phase detection circuit 400 comprises a first latch 410 and a second latch 420. The first latch 410 provides an output signal, PHASE_1 on a line 445, which is provided to the delay unit 310. The second latch 420 provides an output signal, PHASE_2 on a line 455, which is provided to the delay unit 310. In one embodiment, the PHASE_1 and the PHASE_2 signals may be used to provide various signals to cause the register 307 to perform a shift-left function, a shift-right function, or a no-shift function. These signals are described in further details below. The input to the first latch 410 is a DLL_CLOCK signal on a line 435, which is sent to the D input of the first latch 410. The clock DLL_CLOCK on the line 435 is a DLL clock signal that drives the operation of the phase detect signal. The clock DLL_ON on the line 435 is sent to a NAND delay unit 430. The NAND delay unit 430 may comprise various NAND gates among other logic gates to provide a NAND delay to the DLL_CLOCK signal to provide a delayed DLL_CLOCK_DELAY signal on a line 425. In one embodiment, the NAND delay unit 430 provides a fine delay for the DLL circuit 230.

The DLL_CLOCK_DELAY signal on the line 425 is sent to the D input of the second latch 420. The first and the second latches 410, 420 are controlled by a latch clock signal on a line 415. The latch clock and the DLL_CLOCK signal may be subdivisions of a master system clock that may be provided to a device incorporating the DLL circuit 230. The latch clock on the line 415 clocks the D inputs of the first and second latches 410, 420. The Q outputs of the first and second latches 410, 420 respectively provides the PHASE_1 and the PHASE_2 signals on the lines 445 and 455. The PHASE_1 and the PHASE_2 signals may be used to define various signals that would implement the shift-right state, the shift-left state, the shift-left-180 degrees state, or the phase-equal state.

Turning now to FIG. 5, a truth table that provides the decoding of the bits associated with the PHASE_1 and the PHASE_2 signals, is provided. It would be appreciated by those skilled in the art having benefit of the present disclosure that various other latches may be used that would provide for additional shift-right or shift-left accuracy using more than two bits to define more than two phase signals (PHASE_1 and PHASE_2). Implementation of a system with more than two phase signals may be used by those skilled in the art having benefit of the present disclosure and remain within the spirit and scope of the present invention.

In one embodiment, when the PHASE_1 signal and the PHASE_2 signals are at logic high, the result would provide a shift-left signal for use by the DLL circuit 230, as shown in FIG. 5. Similarly, when PHASE_1 is at logic high and PHASE_2 is at logic low, as shown in FIG. 5, the result would be a phase-equal signal being asserted for use by the DLL circuit 230. When the PHASE_1 signal is at logic low and the PHASE_2 signal is also at logic low, the result would be a shift-right signal provided to the DLL circuit 230. Finally, when the PHASE_1 signal is at logic low and the PHASE_2 signal is at logic high, a shift-right-180 degree signal is provided to the DLL circuit 230. Since only two bits are used for defining the delay shift control illustrated in FIG. 5, only four such signals may be decoded. However, any number of signals may be used to define the shift-right or shift-left commands to progressively implement a more accurate implementation of delays provided by the embodiments of the present invention. Therefore, if additional latches were implemented into the phase detection circuit 400 of FIG. 4, the truth table illustrated in FIG. 5 would comprise more phase signals, thereby a greater number of results or assertions would be provided in order to implement more detailed or fine-tuned delays.

Turning now to FIGS. 6A-6D, various illustrations associated with the different results from the combination of the DLL_CLOCK and DLL_CLOCK_DELAY signals is illustrated. It should be noted that the ultimate result of the DLL_CLOCK and DLL_CLOCK_DELAY signal being processed by the first and second latches 410, 420 (see FIG. 4) are the generation of the PHASE_1 and PHASE_2 signals, which control the various state of the DLL circuit 230. FIG. 6A illustrates a shift-left result/state caused by the DLL_CLOCK, and the clock DLL_CLOCK_DELAY and the latch clock signal. Upon a transition from zero to one of the latch clock on the line 415, the PHASE_1 and PHASE_2 signals are at logic high, which results in a shift-left signal assertion, which provides a shift-left state.

FIG. 6B illustrates that upon the transition of the latch clock on the line 415 from low to high, when the DLL_CLOCK signal on the line 435 is at logic high and the DLL_CLOCK_DELAY signal on the line 425 is at logic low, a phase-equal signal is asserted, which provides a phase-equal state. In this state, the PHASE_1 signal is at logic high and the PHASE2 signal is at logic low. As illustrated in FIG. 6C, upon the transition of the latch clock on the line 415 from low to high, when the DLL_CLOCK signal on the line 435 as well as the DLL_CLOCK_DELAY signal on the line 425 are at logic low, a shift-right signal is asserted, thereby prompting a shift-right state. In this state the PHASE_1 signal is at logic low and the PHASE_2 signal is also at logic low. As illustrated in FIG. 6D, upon the transition of the latch clock on the line 415 from low to high, when the DLL_CLOCK signal on the line 435 is at logic low, and the DLL_CLOCK_DELAY signal on the line 425 is at logic high, the shift-right-180 degree signal is asserted. In this state the PHASE_1 signal is at logic low and the PHASE_2 signal is at logic high.

The operation of the DLL delays implemented by the DLL circuit 230 is influenced by the assertion of the shift-left, phase-equal, shift-right, shift-right-180 degrees signals described in FIG. 5 and FIGS. 6A-6D. Therefore, for the embodiment illustrated in FIG. 4, four possible states caused by the phase detection circuit 400, the shift-left, the phase-equal, the shift-right and the shift-right-180 degree states. Therefore, during the initialization of the DLL circuit 230, depending on the state of the clock DLL and the clock DLL delay signals, on the lines 435, 425, the DLL will enter into one of the four states described above. However, because of a noise event that may cause a clock jitter, the DLL circuit 230 may enter a undesirable state inadvertently, thereby causing an error in the operation of the DLL circuit 230.

A clock jitter that may be greater than the hysteresis, i.e., the difference between the transition time between the DLL_CLOCK and the clock DLL_CLOCK_DELAY signal may cause an inadvertent transition of a state provided by the phase detection circuit 400, thereby causing a DLL operation error. For example, during utilization of the DLL circuit 230, the resetting and/or initialization of the DLL circuitry 230, the phase detection circuit 400 may provide a shift-right state for the DLL circuit 230. To the DLL circuit 230, the shift-right signal will indicate that the delay implemented by the DLL circuit 230 should move to the right (e.g., a right shift in the register 307). Once in the shift-right state, the next state should be the shift-left-180 degree state, which is then followed by the shift-left state, further followed by the phase-equal state. This is generally the sequence that may occur during the initialization of the DLL circuit 230. At the boundary of the shift-left-180 degree and the shift-left state, a glitch or clock jitter may cause an inadvertent, non-sequential jump to the shift-left-180 degree. The shift-left state may be entered again followed by the shift-left-180 degree, which would then become an unknown state to the DLL circuit 230 causing a problem in the operation of the DLL circuit. In an alternative embodiment, the shift-left, the phase-equal, the shift-right, the shift-right-180 degree signals may be configured such that upon the assertion of a number of these states, an even bigger shift may take place. For example, if a sufficient number of shift-left states are entered, a larger shift to the left may be employed by the delay unit 310. The filter unit 350 (as illustrated in FIG. 3) provides for filtering out possible effects caused by the clock jitter to prevent the delay unit 310 from entering a false state.

Figure 7:
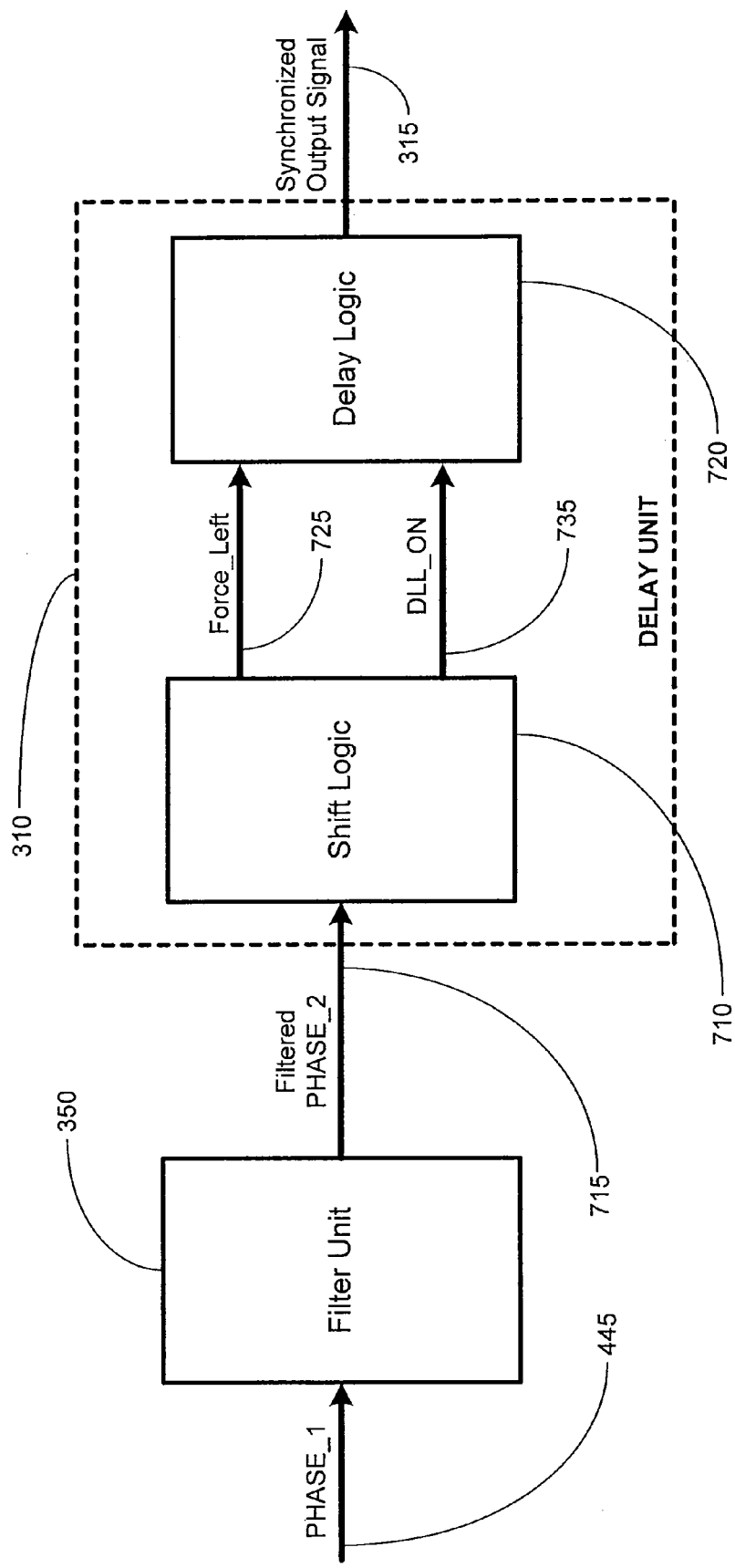
FIG. 7 illustrates a more detailed block diagram representation of the delay unit of FIG. 3, in accordance with one illustrative embodiment of the present invention.

Turning now to FIG. 7, a block diagram depiction of the interaction between the filter unit 350 and the delay unit 31Q, in accordance with one embodiment of the present invention is illustrated. In one embodiment, the PHASE_1 signal 445 is sent to the filter unit 350 for filtration. In one embodiment, the PHASE_1 signal on the line 445 is filtered by the filter unit 350 using a counter. For example, a predetermined count may be required to determine whether the PHASE_1 signal was intended to be asserted or whether the assertion was caused by a clock jitter. In a relatively noise free environment, the counter in the filter unit 350 may be preconditioned to accept an assertion of PHASE_1 upon a smaller amount of counts. For higher noise systems, the counter within the filter unit 350 may be preconditioned to require a higher number of counts for an acceptable determination that the PHASE_1 signal has been asserted. Other types of filters may be employed into the filter unit 350 and remain within the scope and spirit of the present invention.

From the state boundary between the shift-left-180 degree state and the phase-equal state, generally, greater than 10 shifted clock signals may be required for a scenario of 250 ps per state with a system clock being a 5 nanosecond clock. Therefore, this implementation of the filter unit 350 would not affect the DLL operation and the lock time, aside from the benefit of reducing noise effects that may result in the inadvertent resetting of the DLL circuit 230. The filter unit 350 provides a filtered PHASE_2 signal on a line 715. The delay unit 310, as illustrated in FIG. 7, may comprise a shift logic 710 and a delay logic 720. Various other logic portions may be implemented into the delay unit 310 to effectuate desired delay locking functions and remain within the spirit and scope of the present invention.

In one embodiment, the filtered PHASE_1 signal on the line 715 may drive the shift logic 710 to perform the entry of an appropriate phase state (i.e., the shift-left, phase-equal, the shift-right, the shift-right-180 degrees, and the phase-equal states). The shift logic 710 may generate a force-left signal on a line 725. The shift logic may also generate a DLL_ON signal on a line 735. The delay logic 720 may comprise various delay elements that provide predetermined addition or subtraction of delays to provide the delay lock loop function. The DLL_ON signal on the line 735 may turn on a DLL function provided by the delay logic 720. The force-left signal on the line 725 may provide the ability to disable a shift-right signal by forcing the assertion of the force-left signal on the line 725, thereby providing a desired state operation by the delay logic 720.

In one embodiment, upon a DLL reset, the delay logic 720 will be in a shift-left mode due to the assertion of the force-left signal on the line 725, until it can achieve a phase-equal state. If the starting condition of the phase detection state is at a shift-right state, the force-left signal on the line 725 is asserted continuously until the delay unit 310 enters a shift-left state, where the filtered PHASE_1 signal is at logic high. Once the shift-left state is entered, the force-left signal on the line 725 is reset and the PHASE_2 signal is at logic high, which would hold the shift-left signal at logic high to insure that the delay lock loop function continues to be in the shift-left mode. The delay lock loop function will continue to be in the shift-left mode until the PHASE_2 signal transitions to logic low, which will signify that the phase-equal state has been achieved. When the phase-equal state has been achieved, the DLL_ON signal on the line 735 would reset to logic low and the various delay portions of the delay unit 310 will be turned on, thereby implementing a locked loop function.

During the proper operation of the phase detection sequence provided by the delay lock loop circuit 230, at DLL initialization, a handshake sequence between the force-left signal on the line 725 and the PHASE_2 signal occurs, which holds the shift-left signal at logic high at the transition from the shift-left-180 degree state and the shift-left crossing state occurs. However, a clock jitter that may be larger than the hysteresis element (i.e, delta between clock DLL and clock DLL delay) may occur. When this occurs, due to the clock jitter, the force-left signal on the line 725 resets and the PHASE_2 will transition to low logic. As a result, the DLL_ON signal 735 will be reset prematurely as the delay logic 720 expects a phase-equal signal assertion upon the PHASE_2 signal transitioning to logic high after crossing the shift-left-180 degree boundary.

In order to reduce the possibility of delay logic loop errors, instead of having the PHASE_1 signal go directly to the shift logic 710 to provide the reset or the assertion force-left (on the line 725 in FIG. 7), embodiments of the present invention provide for the filter unit 350 to filter the PHASE_1 signal to provide the filtered PHASE_1 on the line 715. Therefore, the filtered PHASE_1 signal on the line 715 would cause the shift logic 710 to assert the force-left signal on the line 725. The implementation of the filter unit 350 would provide for substantial assurance that the assertion of the PHASE_1 signal being detected is a legitimate PHASE_1 logic high and therefore a true reset of the delay logic 720 is actually required. This would prevent the unexpected reset of DLL_ON on the line 735, which would cause the delay logic 720 to exit the delay logic function due to the clock jitter noise. Even with the clock jitter noise at the shift-left-180 degree state boundary, the DLL logic 720 would continue to be on the shift-left mode while the PHASE_1 logic high states are being counted and validated by the filter unit 350.

A genuine PHASE_1 logic high will be registered for the resetting of the force-left signal on the line 725 after a few consecutive predetermined number of time periods where PHASE_1 logic remains at a logic high has been detected by the filter unit 350. From the shift-left-180 degree boundary to the phase-equal state, as described below, will generally take a number of shifted states, thereby preventing adverse affects to the DLL operation and lock-time when there is no noise or clock jitters. Therefore, implementation of the filter unit 350 by embodiments of the present invention during the DLL initialization generally would not adversely affect the normal operation of the DLL circuit 230 after the delay unit 310. The output of the delay logic on the line 315 would provide a synchronized output signal that is locked at the phase-equal state on the line 315.

Figure 8:
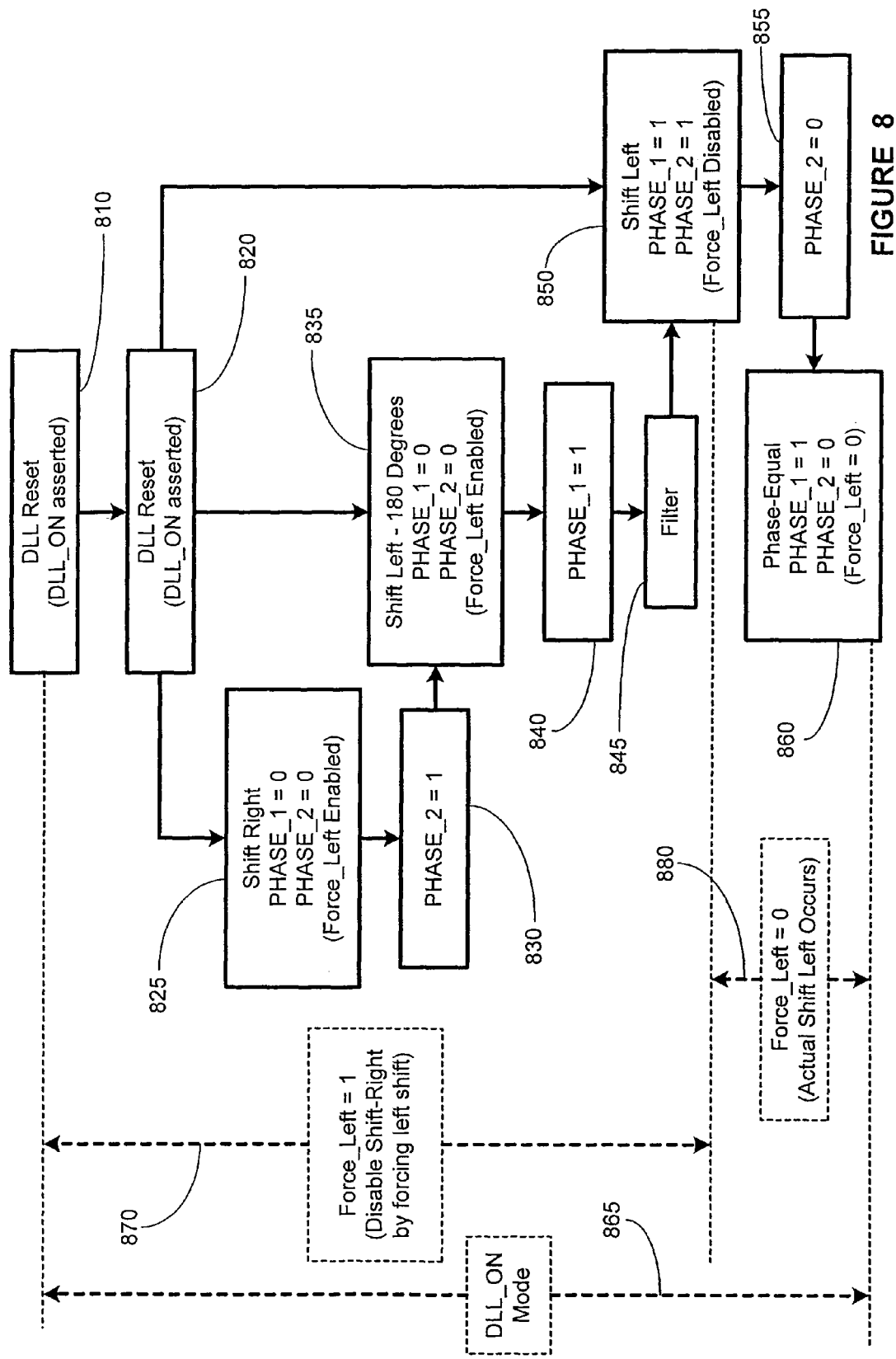
FIG. 8 illustrates a flowchart representation of the various states traversed by the delay lock loop circuit.

Turning now to FIG. 8, a block diagram depiction of the state flow of the DLL circuit 230 is illustrated. In one embodiment, the DLL circuit 230 may enter a DLL reset, which may also include the assertion of the DLL_ON signal on the line 735, which resets the delay logic 720 (block 810). Upon such reset, the delay lock loop is initialized and enters the initialization state (block 820). This may include the assertion of the force-left signal on the line 725. Upon initialization of the delay unit 310, one of three states may be entered. In one embodiment, after the initialization, the shift-right state is entered by the delay logic 720 (block 825). This calls for the PHASE_1 signal (see FIGS. 5 and 6) being at logic low and the PHASE_2 signal being at logic low, wherein the force-left is enabled. Subsequently, the PHASE_2 signal will transition to logic high (block 830). This would lead to the state of shift-left-180 degree (block 835). Alternatively, the DLL initialization of block 820 may lead directly to the shift-left-180 degree (block 835). This calls for the PHASE_1 signal to be at logic low and the PHASE_2 signal to be at logic high.

Subsequently, the PHASE_1 signal will transition to logic high (block 840). Upon the assertion of the PHASE_1 signal, the implementation of the filter unit 350 would provide a filtering function upon the PHASE_1 signal (block 845). Subsequent to the filtering function, a force-left signal resulting from the filtered PHASE_1 signal is provided, such that the delay logic 720 enters the shift-left state (block 850). This state calls for the PHASE_1 signal as well as the PHASE_2 signal to be at logic high. At this point, the force-left signal is disabled when the shift-left state is achieved. The filtering process in block 845 provides for subsequent assurances that the PHASE_1 signal did indeed reach logic high and it was not merely a false high due to a noise problem, such as a clock jitter.

Without the implementation of the filter unit 350, various errors could occur. One such error includes the fact that in block 825, due to the clock jitter or noise, the latch clock (shown in FIG. 4) may sample the PHASE_1 signal at a logic high at a shift-left state, causing the force-left signal on a line 725 to reset, where the PHASE_2 may be at a logic low in the shift-right state. This would cause the false detection of a phase-equal state, which may prompt the inadvertent assertion of the DLL_ON signal on the line 735 when the DLL circuit 230 is actually in the shift-right state, where the PHASE_1 and PHASE_2 signals are at logic low. This error may be prevented by the implementation of the filter 345. For instance, at Time=0, a shift-left state may occur due to PHASE_1 being sampled at logic high, thereby resetting the force-left mode. At Time=1, due to clock jitter, a logic low may be sampled on PHASE_2 in the shift-right state. This problem may be prevented by the implementation of the filter 345. Using the filter 345, a possibility of a premature exit of the DLL logic loop is substantially reduced.

A line 870 in FIG. 8 indicates a time line from the block 810 to the block 850, which is defined by the force-left signal being at logic high, thereby disabling the shift-right by forcing the left transition provided by the force-left signal. Subsequent to block 850, (i.e., the shift-left state) the PHASE_2 signal transitions back to zero (block 855). Upon this transition, the delay unit 310 achieves a phase-equal state (block 860). This may be defined by the PHASE_1 being at logic high, the PHASE_2 signal at logic low. Additionally, the force-left signal and the DLL_ON signal are de-asserted and sent back to logic low. At this point, the actual shift-left is allowed to occur, as indicated by the time line 880. The entire operation from DLL reset at block 810 to the achieving of the phase-equal state at block 860 is encompassed by the DLL_ON mode indicated by a time line 865. Therefore, utilizing the filter 350 provided by embodiments of the present invention, a momentary high state of the PHASE_1 signal is filtered, thereby essentially eliminating an undefined state entered by the delay unit 310. Additionally, the filter 350 will generally not affect the delay lock loop locking speed operation since the PHASE_1 high state is generally expected to continue for many consecutive cycles before achieving the DLL phase lock.

Implementing embodiments of the present invention, a more accurate implementation of a delay lock loop phase locking is provided, thereby more accurate transition of data transmission is provided by devices utilizing the novel embodiments of the present invention. Therefore, more accurate operations of various devices, such as memory devices, may be realized. The delay lock loop circuit 230 described by embodiments of the present invention may be implemented into a variety of electronic circuits. The teachings of the present invention may be implemented on a plurality of types of memory devices, such as flash memory, DRAM memory, static random access memory (SRAM), double-data rate synchronous DRAM (DDR SDRAM), Rambus™ DRAM (RDRAM), FLASH memory device, and/or other volatile and non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A delay lock loop comprising:
   a delay unit configured to delay a reference signal in accordance with a control signal to provide an output signal;
   a phase detector configured to receive the reference signal and a feedback signal, wherein the phase detector is configured to detect a difference between phases of the reference signal and the feedback signal, wherein the phase detector comprises:
      a first latch configured to latch a clock signal and provide a first bit of the control signal;
      a second latch configured to latch a delayed clock signal and provide a second bit of the control signal; and
      a filter unit configured to filter the first bit of the control signal.

2. The delay lock loop of claim 1 wherein the phase detector further comprises a delay unit configured to provide the delayed clock signal.

3. The delay lock loop of claim 1 wherein the filter unit comprises a counter.

4. The delay lock loop of claim 1 wherein the filter unit is configured to filter the first bit of the control signal by requiring a predetermined count of the first bit of the control signal to determine an intended assertion of the first bit.

5. The delay lock loop of claim 1 wherein the filter unit is configured to detect the first bit of the control signal at a logic level after a few consecutive predetermined number of time periods.

6. The delay lock loop of claim 1 wherein the delay unit comprises:
   shift logic configured to receive the first bit of the control signal from the filter unit and generate signals responsive thereto; and
   delay logic coupled to the shift logic having a state operation, the state operation based at least in part on the signals from the shift logic.

7. The delay lock loop of claim 1 wherein the filter unit is configured to filter the first bit of the control signal to filter out possible effects caused by the clock jitter to prevent the delay unit from entering a false state.

8. A device, comprising:
   a filter unit to filter a phase control signal to provide a filtered phase control signal; and
   a delay unit configured to provide an output signal, said delay unit comprising a register and a delay line, said register configured to shift left or shift right to provide a signal to control a delay of said delay line, said delay unit further comprising delay logic and shift logic operatively coupled to said register, said shift logic configured to provide a force-left shift signal to said delay logic upon initialization of said delay logic, said shift logic further configured to provide a DLL_ON signal to said delay logic, said shift logic being at least partially controlled by the filtered phase control signal.

9. The device of claim 8 wherein the filter unit is configured to require a predetermined count to determine whether the phase control signal is intended to be asserted.

10. The device of claim 8 wherein the shift logic is configured to assert the force-left shift signal until the delay unit enters a shift-left state.

11. The device of claim 8 wherein the shift logic is configured to assert the force-shift left signal until the filtered phase control signal is asserted.

12. The device of claim 8 wherein the shift logic is configured to provide a DLL_ON signal responsive to the delay unit entering a phase-equal state.

13. The device of claim 8 wherein the filter unit is configured to require a predetermined time period of an assertion of the phase control signal before an actual assertion is recognized.

14. The device of claim 8 wherein the filter unit comprises a phase glitch error filter for the device.

15. A method, comprising:
   forcing a delay unit of a delay lock loop to increase delay until control signals from a phase detector indicate a phase-equal state have been achieved; and
   filtering a first one of the control signals from the phase detector to provide a filtered control signal by requiring a minimum predetermined time period of an assertion of the first one of the control signals before an actual assertion is recognized, the filtered control signal used in combination with a second one of the control signals to indicate the phase-equal state has been achieved.

16. A method, comprising:
   forcing a delay unit of a delay lock loop to increase delay until control signals from a phase detector indicate a phase-equal state have been achieved by:
      starting a phase detection state at a shift-right state;
      continuing to force a force-left shift until a shift-left state is entered;
      entering the shift-left state;
      holding the shift-left state until a phase-equal state is achieved; and
      achieving the phase-equal state; and
   filtering a first one of the control signals from the phase detector to provide a filtered control signal used in combination with a second one of the control signals to indicate the phase-equal state has been achieved.

17. A method, comprising:
   forcing a delay unit of a delay lock loop to increase delay until control signals from a phase detector indicate a phase-equal state have been achieved; and
   filtering a first one of the control signals from the phase detector to provide a filtered control signal used in combination with a second one of the control signals to indicate the phase-equal state has been achieved, wherein filtering includes after a plurality of consecutive predetermined number of time periods wherein the first one of the control signals remains at a logic level, registering the first one of the control signals.

18. A method comprising:
resetting a delay lock loop;
entering a shift-left mode to begin forcing the delay of the delay unit to increase;
forcing a delay unit of a delay lock loop to increase delay until control signals from a phase detector indicate a phase-equal state have been achieved; and
filtering a first one of the control signals from the phase detector to provide a filtered control signal used in combination with a second one of the control signals to indicate the phase-equal state has been achieved.

19. The method of claim 18 wherein filtering a first one of the control signals from the phase detector comprises:
requiring a predetermined count to determine whether the first one of the control signals was intended to be asserted.

\* \* \* \* \*